United States Patent
Sakai

(10) Patent No.: US 9,143,104 B2
(45) Date of Patent: Sep. 22, 2015

(54) AUDIO SIGNAL PROCESSING CIRCUIT, CAR AUDIO APPARATUS USING THE SAME, AUDIO COMPONENT APPARATUS, ELECTRONIC DEVICE AND OUTPUT AUDIO SIGNAL GENERATING METHOD

(71) Applicant: ROHM CO., LTD., Kyoto (JP)

(72) Inventor: Mitsuteru Sakai, Kyoto (JP)

(73) Assignee: ROHM CO., LTD. (JP)

( * ) Notice: Subject to any disclaimer, the term of this patent is extended or adjusted under 35 U.S.C. 154(b) by 372 days.

(21) Appl. No.: 13/839,367

(22) Filed: Mar. 15, 2013

(65) Prior Publication Data

US 2013/0243223 A1 Sep. 19, 2013

(30) Foreign Application Priority Data

Mar. 16, 2012 (JP) .................................. 2012-60744

(51) Int. Cl.
| | |
|---|---|
| H03F 99/00 | (2009.01) |
| H03F 3/187 | (2006.01) |
| H04R 5/04 | (2006.01) |
| H04S 1/00 | (2006.01) |
| H04S 3/00 | (2006.01) |

(52) U.S. Cl.
CPC ................ H03F 21/00 (2013.01); H03F 3/187 (2013.01); H04R 5/04 (2013.01); H04R 2499/11 (2013.01); H04R 2499/13 (2013.01); H04R 2499/15 (2013.01); H04S 1/00 (2013.01); H04S 3/00 (2013.01)

(58) Field of Classification Search
None
See application file for complete search history.

(56) References Cited

U.S. PATENT DOCUMENTS 5,701,353 A * 12/1997 Mamada ........................ 381/106
2008/0152166 A1* 6/2008 Shiomi ............................ 381/86

FOREIGN PATENT DOCUMENTS

| JP | 1175287 A | 3/1999 |
|---|---|---|
| JP | 2003231764 A | 8/2003 |
| JP | 2004222077 A | 8/2004 |
| JP | 2005117489 A | 4/2005 |
| JP | 2005217496 A | 8/2005 |
| JP | 2005217710 A | 8/2005 |
| KR | 1020050113042 A | 12/2005 |
| KR | 1020120051841 A | 5/2012 |
| WO | WO2007063772 | * 6/2007 |

* cited by examiner

Primary Examiner — Regina N Holder
(74) Attorney, Agent, or Firm — Cantor Colburn LLP

(57) ABSTRACT

An audio signal processing circuit includes a first amplifier to generate a first analog audio signal; a second amplifier to generate a second analog audio signal; an analog/digital converter to generate a first digital audio signal; a digital signal processing unit to output a second digital audio signal; a digital/analog converter to generate differential third analog audio signals; a third amplifier for inverting a positive signal of the third analog audio signals and adding it to a negative signal to generate a single-ended fourth analog audio signal; and a fourth amplifier to generate an output audio signal.

13 Claims, 7 Drawing Sheets

COMPARATIVE TECHNIQUE

AUDIO SIGNAL PROCESSING CIRCUIT, CAR AUDIO APPARATUS USING THE SAME, AUDIO COMPONENT APPARATUS, ELECTRONIC DEVICE AND OUTPUT AUDIO SIGNAL GENERATING METHOD

CROSS-REFERENCE TO RELATED APPLICATION

This application is based upon and claims the benefit of priority from Japanese Patent Applications No. 2012-60744, filed on Mar. 16, 2012, the entire contents of which are incorporated herein by reference.

TECHNICAL FIELD

The present disclosure relates to an audio signal processing circuit.

BACKGROUND

An electronic device with an ability of reproducing an audio signal including a CD player, an audio amplifier, a car stereo, a portable radio, or a portable audio player includes a sound processor for performing various signal processes on the audio signal. FIG. 1 is a block diagram showing a configuration of a typical audio system.

An audio system 1001 includes a sound source 1002, an analog amplifier 1004, an analog/digital converter 1010, a DSP (Digital Signal Processor or Digital Sound Processor) 1012, a digital/analog converter 1014, an analog amplifier 1006, a power amplifier 1008, and an electro-acoustic transducer 1009.

The sound source 1002 may be a CD player, a silicon audio player, a mobile phone terminal or the like that outputs an analog audio signal. The analog amplifier 1004 amplifies the analog audio signal from the sound source 1002 to match an input range of the subsequent analog/digital converter 1010. The DSP 1012 receives a digital audio signal from the preceding analog/digital converter 1010 to perform predetermined digital signal processes. The signal processes performed by the DSP 1012 may include equalizing, bass boost, treble boost, stereo/mono conversion, digital volume control, and so forth.

The digital/analog converter 1014 converts the digital audio signal processed by the DSP 1012 to an analog audio signal. The analog amplifier 1006, such as an analog volume circuit, amplifies the analog output signal of the digital/analog converter 1014 with a gain corresponding to a volume value. The power amplifier 1008 amplifies an output of the analog amplifier 1006 to drive the electro-acoustic transducer 1009 such as a speaker or a headphone.

SUMMARY

An audio IC (Integrated Circuit) 1020 integrated on a single semiconductor substrate includes the DSP 1012, the preceding analog/digital converter 1010 and the subsequent digital/analog converter 1014, and an analog circuit blocks such as the analog amplifier 1004, the analog amplifier 1006, etc. are provided outside the audio IC 1020 in the audio system 1001.

It is possible to simplify the audio system 1001 of FIG. 1 by integrating the analog amplifier 1004 and the analog amplifier 1005 on the audio IC. However, a switched capacitor filter (SCF), an oscillator or a PLL (Phase Locked Loop), a gate cell, a level shift circuit and so forth are provided and a clock noise is generated inside the audio IC 1020. When the analog amplifier 1004 and the analog amplifier 1006 are built in the audio IC 1020, there is a problem that the clock noise enters the analog amplifier 1004 and the analog amplifier 1106 via space or the semiconductor substrate, worsening an S/N ratio or a dynamic range to deteriorate a sound quality.

The present disclosure provides some embodiments of an audio signal processing circuit in which an analog amplifier and a DSP are integrated on a single semiconductor substrate while suppressing the deterioration of a sound quality.

An embodiment of the present disclosure relates to an audio signal processing circuit for receiving an analog single-ended input audio signal and performing a predetermined signal processing thereon to generate an analog single-ended output audio signal. The audio signal processing circuit including a first amplifier, a second amplifier, an analog/digital converter, a digital signal processing unit, a digital/analog converter, a third amplifier, and a fourth amplifier is integrated on a semiconductor substrate.

The first amplifier performs a non-inverting amplification on the input audio signal to generate a first analog audio signal. The second amplifier performs an inverting amplification on the first analog audio signal to generate a second analog audio signal. The analog/digital converter has differential input terminals and receives the first analog audio signal at its positive input terminal and the second analog audio signal at its negative input terminal to convert them into a first digital audio signal. The digital signal processing unit performs a predetermined signal processing on the first digital audio signal to output a second digital audio signal. The digital/analog converter converts the second digital audio signal into differential third analog audio signals. The third amplifier subtracts a positive signal of the third analog audio signals from a negative signal of the third analog audio signals to generate a single-ended fourth analog audio signal. The fourth amplifier performs an inverting amplification on the fourth analog audio signal to generate the output audio signal.

Another embodiment of the present disclosure also relates to an audio signal processing circuit. The audio signal processing circuit including a first amplifier, a second amplifier, an analog/digital converter, a digital signal processing unit, a digital/analog converter, a third amplifier, and a fourth amplifier is integrated on a semiconductor substrate.

The first amplifier performs a non-inverting amplification on an input audio signal to generate a first analog audio signal. The second amplifier performs an inverting amplification on the first analog audio signal to generate a second analog audio signal. The analog/digital converter 10 has differential input terminals and receives the first analog audio signal at its positive input terminal and the second analog audio signal at its negative input terminal to convert them into a first digital audio signal. The digital signal processing unit performs a predetermined signal processing on the first digital audio signal to output a second digital audio signal. The digital/analog converter converts the second digital audio signal into differential third analog audio signals. The third amplifier inverts a positive signal of the third analog audio signals and adds it to a negative signal of the third analog audio signals to generate a single-ended fourth analog audio signal. The fourth amplifier performs an inverting amplification on the fourth analog audio signal to generate an output audio signal.

According to the embodiments, the audio signal transmitted through a first path from the output of the first amplifier to the analog/digital converter and the audio signal transmitted through a second path from the output of the digital/analog converter to the input of the fourth amplifier are reverse-phased to each other. As a result, when a noise occurred in the digital signal processing unit is mixed into the audio signal of the first path and the audio signal of the second path, noise components cancel each other, thus making it possible to suppress the degradation of sound quality.

The first amplifier may include a first resistor and a second resistor configured to divide the input audio signal and a predetermined bias voltage, and a first operational amplifier configured to receive the divided audio signal and output the first analog audio signal.

The second amplifier may include a second operational amplifier (the predetermined bias voltage is applied to its non-inverting input terminal), a third resistor provided between an inverting input terminal of the second operational amplifier and an output terminal of the first amplifier, and a fourth resistor provided between an output terminal and the inverting input terminal of the second operational amplifier.

The third amplifier may include a third operational amplifier, a fifth resistor provided between a non-inverting input terminal of the third operational amplifier and a negative output terminal of the digital/analog converter, a sixth resistor provided between a bias line to which the predetermined bias voltage is supplied and the non-inverting input terminal of the third operational amplifier, a seventh resistor provided between an output terminal and an inverting input terminal of the third operational amplifier, an eighth resistor provided between the inverting input terminal of the third operational amplifier and a positive output terminal of the digital/analog converter.

The fourth amplifier may include a fourth operational amplifier (the predetermined bias voltage is applied to its non-inverting input terminal), a ninth resistor provided between an inverting input terminal of the fourth operational amplifier and an output terminal of the third amplifier, and a tenth resistor provided between an output terminal and the inverting input terminal of the fourth operational amplifier.

The fourth amplifier may be a variable gain amplifier.

Another embodiment of the present disclosure relates to a car audio apparatus. The car audio apparatus includes any one of the above-described audio signal processing circuits.

Another embodiment of the present disclosure relates to an audio component apparatus. The audio component apparatus includes any one of the above-described audio signal processing circuits.

In addition, methods, apparatuses, systems in which any combination of the above-described components, or components or expressions of the present disclosure are replaced with one another are also effective as embodiments of the present disclosure.

DETAILED DESCRIPTION

Embodiments of the present disclosure will be described below with reference to the drawings. Throughout the drawings described herein below, identical or equivalent components, members, and processes will be designated by identical reference symbols, and duplicate descriptions will be omitted. Further, these embodiments have been presented by way of example only, and are not intended to limit the scope of the disclosures. All features and combinations described in the embodiments are not necessarily essential to the present disclosure.

As used herein, 'a state in which a member A is connected with a member B' includes not only a case in which the member A and the member B are directly connected physically, but also a case in which the member A is connected to the member B indirectly via another member which does not substantially affect the electrical connection status. Similarly, 'a state in which a member C is provided between a member A and a member B' includes not only a case in which the member C is directly connected with the member A or with the member B, but also a case in which the member C is indirectly connected with the member A or with the member B via another member which does not affect the electrical connection status.

Figure 1:
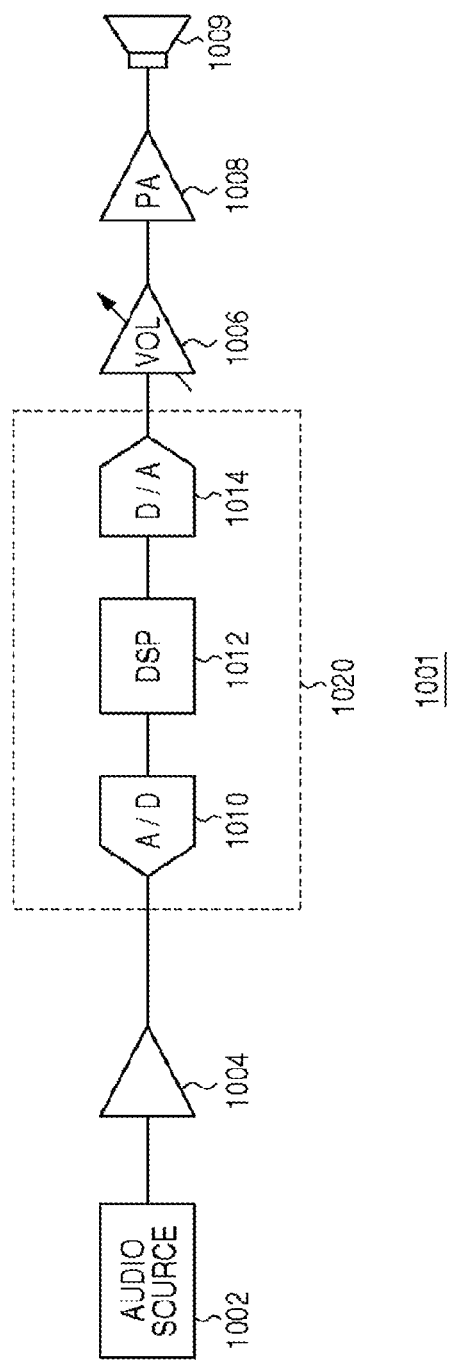
FIG. 1 is a block diagram showing a configuration of a typical audio system.
Figure 2:
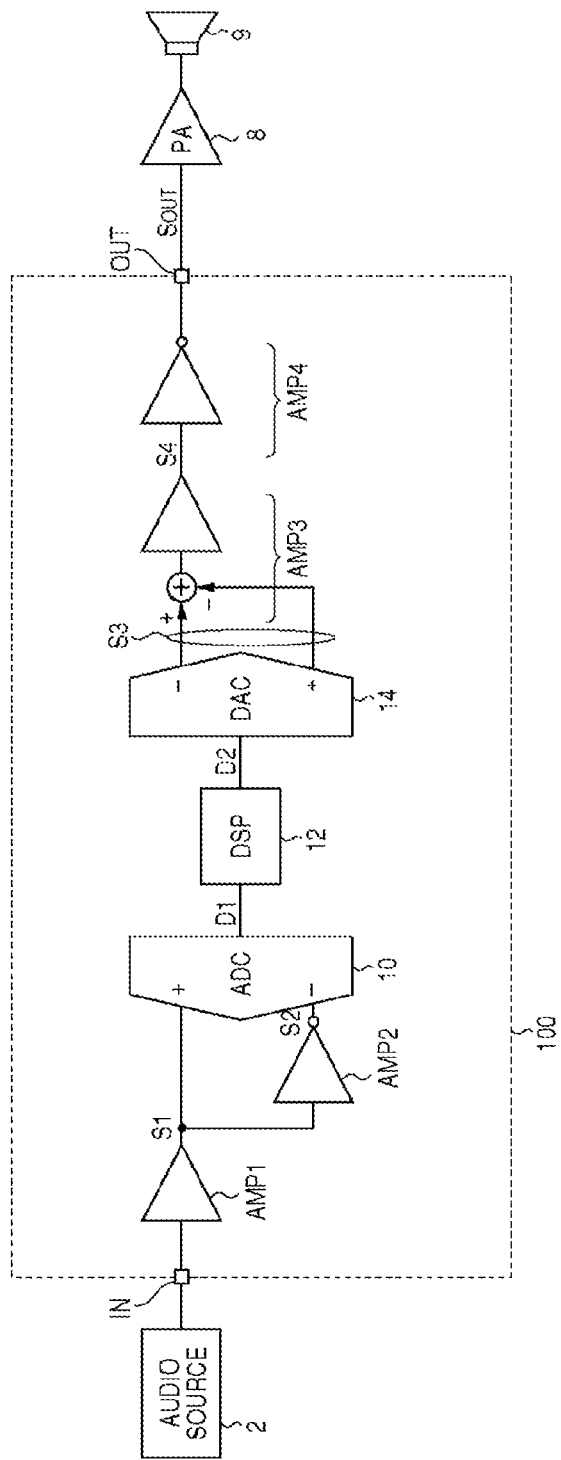
FIG. 2 is a block diagram showing a configuration of an audio system including an audio signal processing circuit according to an embodiment of the present disclosure.

FIG. 2 is a block diagram showing a configuration of an audio system 1 including an audio signal processing circuit 100 according to an embodiment of the present disclosure. The audio system 1 includes a sound source 2, the audio signal processing circuit 100, a power amplifier 8, and an electro-acoustic transducer 9. The audio signal processing circuit 100 of FIG. 2 is an IC formed by integrating the analog amplifier 1004 and the analog amplifier 1006 in FIG. 1 on the audio IC 1020 of the audio system 1001 in FIG. 1.

The audio signal processing circuit 100 receives an analog single-ended input audio signal $S_{IN}$ from the preceding sound source 2 and performs a predetermined signal processing on it to generate an analog single-ended output audio signal $S_{OUT}$. The output audio signal $S_{OUT}$ is amplified by the subsequent power amplifier 8 and output to the electro-acoustic transducer 9. A circuit block (not shown) may be inserted between the audio signal processing circuit 100 and the sound source 2, or between the audio signal processing circuit 100 and the power amplifier 8.

The audio signal processing circuit 100 includes a first amplifier AMP1, a second amplifier AMP2, an analog/digital converter 10, a digital signal processing unit 12, a digital/analog converter 14, a third amplifier AMP3, and a fourth amplifier AMP4.

The first amplifier AMP1 performs non-inverting amplification on the input audio signal $S_{IN}$ to generate a first analog audio signal S1. The second amplifier AMP2 performs inverting amplification on the first analog audio signal S1 to generate a second analog audio signal S2.

The analog/digital converter 10 has differential input terminals including a positive input terminal and a negative input terminal. The first analog audio signal S1 and the second analog audio signal S2 are received at the positive input terminal and the negative input terminal, respectively, of the analog/digital converter 10, and then converted into a first digital audio signal D1. The digital signal processing unit 12 performs a predetermined signal processing on the first digital audio signal D1 to output a second digital audio signal D2. The signal processing performed by the digital signal processing unit 12 is not particularly limited. The digital signal processing unit 12 may include, for example, a digital volume circuit, a multi-band equalizer, a loudness circuit, a high-pass filter, a low-pass filter and a bass boost circuit.

The digital/analog converter 14 converts the second digital audio signal D2 into differential third analog audio signals S3. A positive signal of the third analog audio signals S3 is output from a positive output terminal of the digital/analog converter 14, and a negative signal of the third analog audio signals S3 is output from a negative output terminal of the digital/analog converter 14.

The third amplifier AMP3 subtracts the positive signal of the third analog audio signals S3 from the negative signal of the third analog audio signals S3 to generate a single-ended fourth analog audio signal S4. In other words, the third amplifier AMP3 inverts the positive signal of the third analog audio signals S3 and adds it to the negative signal of the third analog audio signals S3 to generate the fourth analog audio signal S4.

The fourth amplifier AMP 4 performs the inverting amplification on the fourth analog audio signal S4 to generate the output audio signal $S_{OUT}$.

Figure 3:
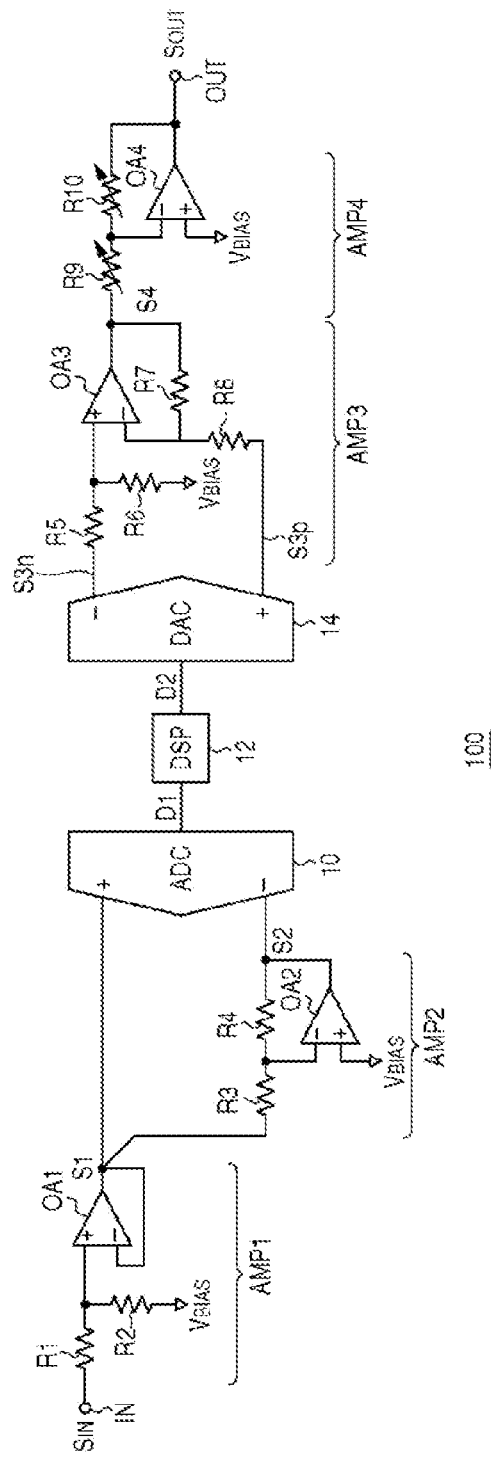
FIG. 3 is a circuit diagram showing an example of a specific configuration of the audio signal processing circuit.

FIG. 3 is a circuit diagram showing an example of a specific configuration of the audio signal processing circuit 100.

The first amplifier AMP1 and the second amplifier AMP2 constitute a single-ended differential conversion circuit.

The first amplifier AMP1 includes a first resistor R1, a second resistor R2, and a first operational amplifier OA1. An output terminal and an inverting input terminal of the first operational amplifier OA1 are connected to each other to constitute a voltage follower. The first resistor R1 and the second resistor R2 divide the input audio signal $S_{IN}$ and a predetermined bias voltage $V_{BIAS}$. The first operational amplifier OA1 receives the divided input audio signal $S_{IN}'$ to output the first analog audio signal S1. The first amplifier AMP1 is a non-inverting amplifier having a gain K1 given by Equation (1). The bias voltage $V_{BIAS}$ corresponds to a common voltage level of the differential signal to input to the analog/digital converter 10. For example, the bias voltage $V_{BIAS}$ is determined to be a midpoint level $V_{DD}/2$ of a power supply voltage $V_{DD}$.

$$K1=R2/(R1+R2) \quad (1)$$

The second amplifier AMP2 includes a third resistor R3, a fourth amplifier R4, and a second operational amplifier OA2. The bias voltage $V_{BIAS}$ is applied to a non-inverting input terminal of the second operational amplifier OA2. The third resistor R3 is provided between an inverting input terminal of the second operational amplifier OA2 and an output terminal of the first amplifier AMP1. The fourth resistor R4 is provided between an output terminal and the inverting input terminal of the second operational amplifier OA2.

The second amplifier AMP2 is an inverting amplifier having a gain K2 given by Equation (2).

$$K2=-R4/R3 \quad (2)$$

The third amplifier AMP3 includes a third operational amplifier OA3, a fifth resistor R5, a sixth resistor R6, a seventh resistor R7, and the eighth resistor R8. The fifth resistor R5 is provided between a non-inverting input terminal of the third operational amplifier OA3 and the negative output terminal of the digital/analog converter 14. The sixth resistor R6 is provided between the non-inverting input terminal of the third operational amplifier OA3 and a bias line (bias terminal) through which the bias voltage $V_{BIAS}$ is supplied. The seventh resistor R7 is provided between an output terminal and an inverting input terminal of the third operational amplifier OA3. The eighth resistor R8 is provided between the inverting input terminal of the third operational amplifier OA3 and the positive output terminal of the digital/analog converter 14.

A gain K3p for a positive signal S3p and a gain K3n for a negative signal S3n of the third analog audio signal in the third amplifier AMP 3 are given by Equation (3). The fourth analog audio signal S4 is a superposition (i.e., sum) of a signal generated by performing the inverting amplification on the signal S3p and a signal generated by performing the non-inverting amplification of the signal S3n.

$$K3p=-R7/R8$$

$$K3n=R6/(R5+R6) \quad (3)$$

The fourth amplifier AMP4 includes a fourth operational amplifier OA4, a ninth resistor R9, and a tenth resistor R10. The bias voltage $V_{BIAS}$ is applied to a non-inverting input terminal of the fourth operational amplifier OA4. The ninth resistor R9 is provided between an inverting input terminal of the fourth operational amplifier OA4 and an output terminal of the third amplifier AMP3. The tenth resistor R10 is provided between an output terminal and the inverting input terminal of the fourth operational amplifier OA4.

The fourth amplifier AMP4 is an inverting amplifier having a gain K4 given by Equation (4).

$$K4=-R9/R10 \quad (4)$$

Alternatively, the fourth amplifier AMP4 may be a variable gain amplifier. In this case, at least one of the ninth resistor R9 and the tenth resistor R10 may be a variable resistor. If the fourth amplifier AMP4 is a variable gain amplifier, it may be used as an analog volume circuit.

In addition, the configurations of the first amplifier AMP1 to the fourth amplifier AMP4 is not limited to those illustrated in FIG. 3, but a different type of amplifier having an equivalent function may be used.

Figure 4:
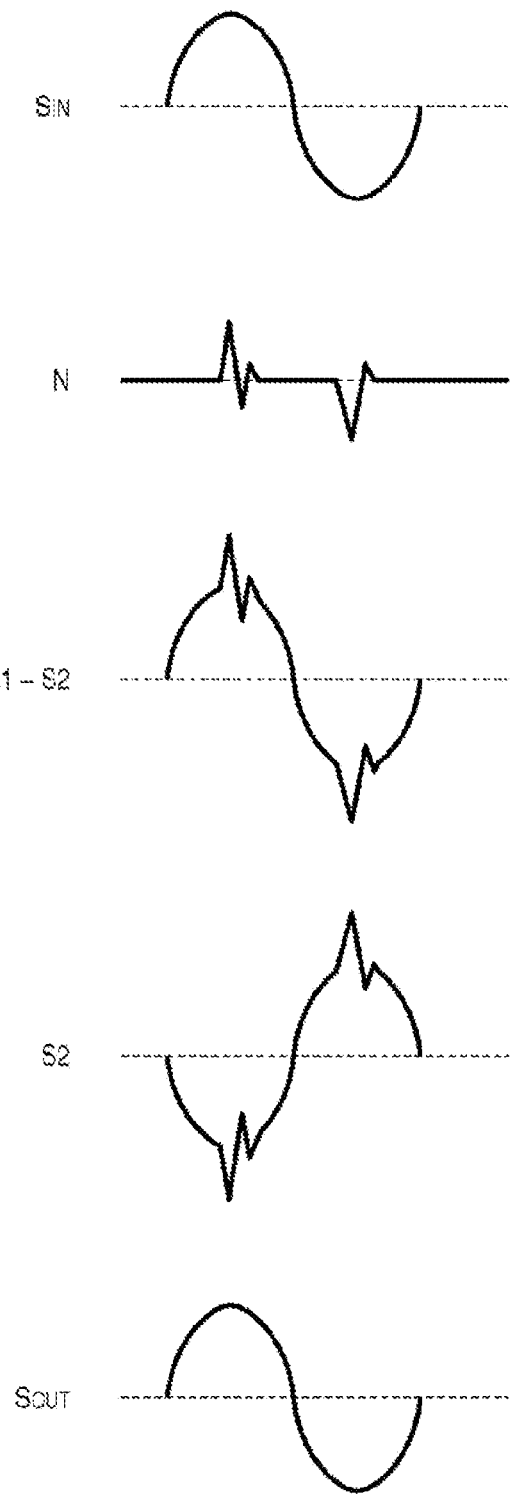
FIG. 4 is a waveform diagram showing an operation of the audio signal processing circuit according to the embodiment of the present disclosure.

Subsequently, an operation of the audio signal processing circuit 100 will be described. FIG. 4 is a waveform diagram showing an operation of the audio signal processing circuit 100 according to the embodiment of the present disclosure. In FIG. 2, a path from the output of the first amplifier AMP1 to the analog/digital converter 10 is considered to be a first path, and a path from the output of the digital/analog converter 14 to the input of the fourth amplifier AMP4 is considered to be a second path. The signal transmitted through the first path and the signal transmitted through the second path are reverse-phased to each other in the audio signal processing circuit 100 of FIG. 2.

A noise N generated in the digital signal processing unit 12 is superimposed on both an audio signal transmitted through the first path and an audio signal transmitted through the second path via space or the semiconductor substrate. When the noise enters the first path, the noise is superimposed on a differential component (S1−S2) of the input signal of the analog/digital converter 10. The differential component (S1−S2) is output in reverse phase from the digital/analog converter 14. When the noise N is superimposed on the signal S3 output in reverse phase, the noise component superimposed on the first path is cancelled, making it possible to remove the noise signal from the output audio signal $S_{OUT}$.

Thus, according to the audio signal processing circuit 100 according to the embodiment, it is possible to integrate the analog amplifiers AMP to AMP4 along with the analog/digital converter 10, the digital signal processing unit 12 and the digital/analog converter 14, while suppressing the deterioration of the sound quality.

Figure 5:
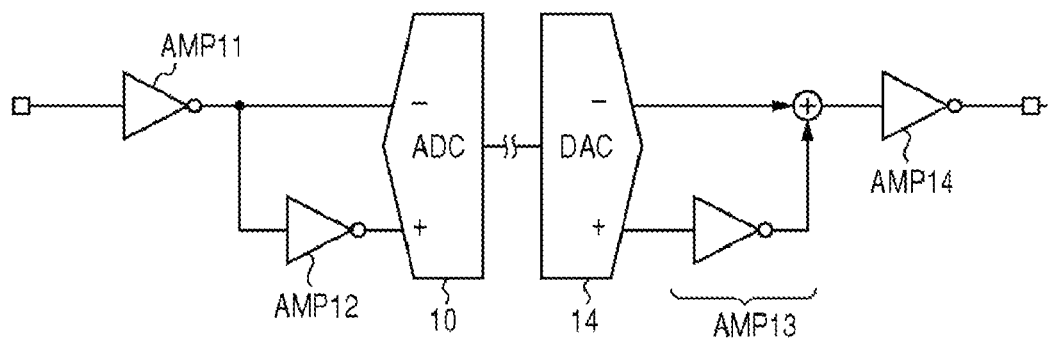
FIG. 5 is a block diagram showing a configuration of an audio signal processing circuit according to a comparative example.

The effect of the audio signal processing circuit 100 according to the embodiment will be apparent in comparison with a comparative example described below. FIG. 5 is a block diagram showing a configuration of an audio signal processing circuit 100r according to the comparative technique. An amplifier AMP11 in the audio signal processing circuit 100r performs an inverting amplification on an input audio signal $S_{IN}$ and outputs it to a negative input terminal of an analog/digital converter 10. An amplifier AMP12 performs the inverting amplification on the output of the amplifier AMP11 and outputs it to a positive input terminal of the analog/digital converter 10. An amplifier AMP13 inverts a positive output signal of the digital/analog converter 14, which is added to a negative output signal of the digital/analog converter 14. The amplifier AMP14 inverts an output of the amplifier AMP 13.

A first path preceding the analog/digital converter 10 and a second path subsequent to the digital/analog converter 14 are in phase. Therefore, when a noise is mixed into the signals of the first path and the second path, they will not be cancelled, but strengthened.

According to the audio signal processing circuit 100 of some embodiments, it is possible to suitably reduce the noise, compared with the comparative example.

Figure 6:
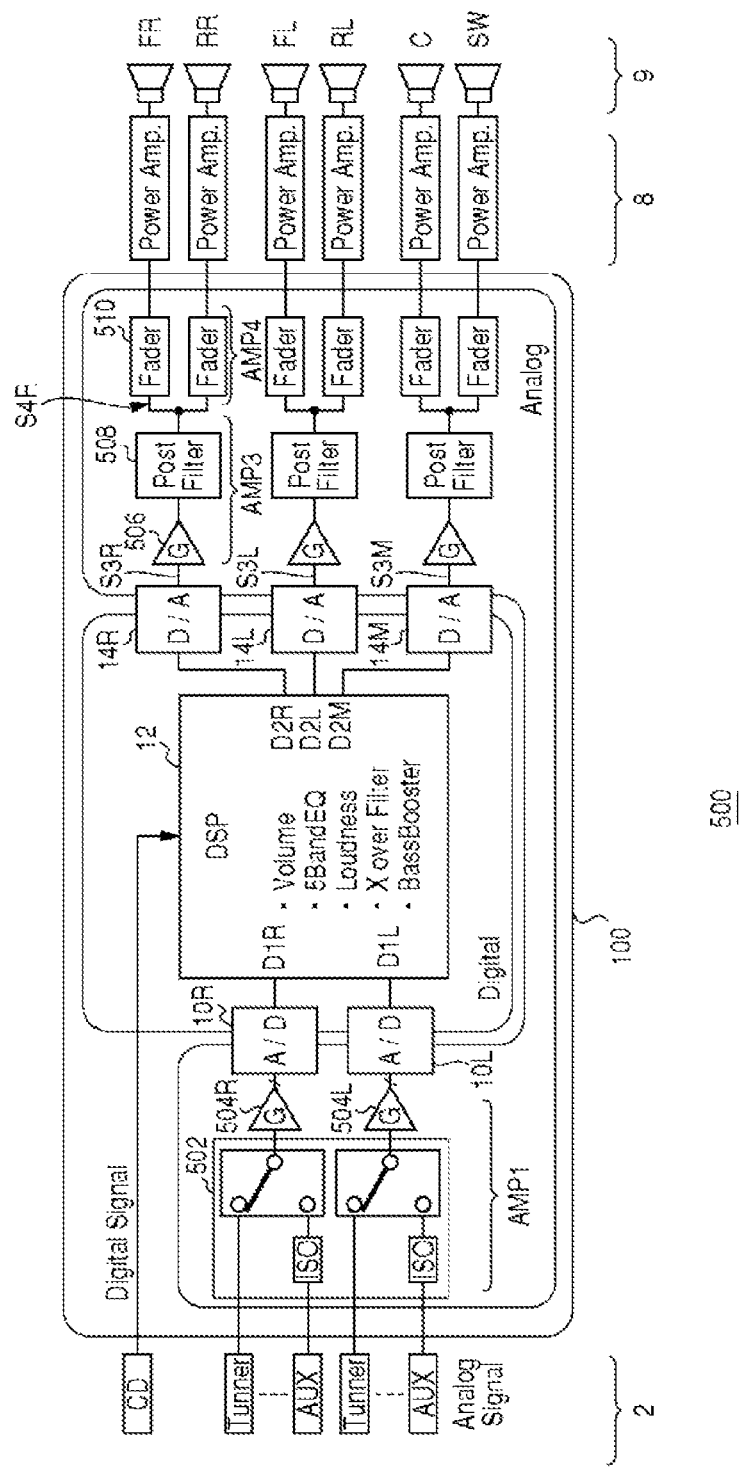
FIG. 6 is a block diagram showing a configuration of a car audio apparatus using the audio signal processing circuit.

FIG. 6 is a block diagram showing a configuration of a car audio apparatus 500 using the audio signal processing circuit 100. The car audio apparatus 500 is constructed with 5.1 channels (front right FR, rear right RR, front left FL, rear left RL, center C, and subwoofer SW).

The audio signal processing circuit 100 receives a digital input from a CD player. The digital input from the CD player is input to a DSP12 directly. In addition, a stereo analog audio signal from a tuner is input to a TUNER channel, and a stereo analog audio signal from a mobile audio player, etc. is input to an AUX channel.

An input selector 502 and an amplifier 504 correspond to the first amplifier AMP1 described above. The first amplifier AMP1 is provided in each of the R channel and the L channel. The first amplifier AMP1 selects an input channel and converts a single-ended analog audio signal of the selected channel into a differential signal. When a differential audio signal is input to the selected channel, a differential conversion processing is skipped.

An analog/digital converter 10R converts the differential input audio signal of the R channel into a digital audio signal D1R, and an analog/digital converter 10L converts the differential input audio signal of the L channel into a digital audio signal D1L.

The digital signal processing unit 12 includes a digital volume circuit, a 5-band equalizer, a loudness circuit, a crossover filter, and a bass boost circuit, and performs a predetermined signal processing on the digital audio signals D1R and D1L.

The digital/analog converter 14R converts a digital audio signal D2R of the R channel into a differential analog audio signal S3R. A digital/analog converter 14L converts a digital audio signal D2L of the L channel into a differential analog audio signal S3L. A digital/analog converter 14M converts a digital audio signal D2M of the remaining channel into a differential analog audio signal S3M.

An amplifier 506 and a post filter 508 of FIG. 6 correspond to the third amplifier AMP3. It will be understood by those skilled in the art that a low-pass filter, a high-pass filter, etc. are constructed by adding a capacitor to the third amplifier AMP3 of FIG. 3. A fader volume 510 corresponds to the fourth amplifier AMP4.

The audio signal processing circuit 100 of FIG. 6 can be applied to not only the car audio apparatus but also the audio component apparatus of a home audio system. Alternatively, the audio signal processing circuit 100 can be equipped in electronic devices such as a TV, a desktop PC, a notebook PC, a tablet PC, a mobile handset, a digital camera, a portable audio player, etc.

Figure 7A:
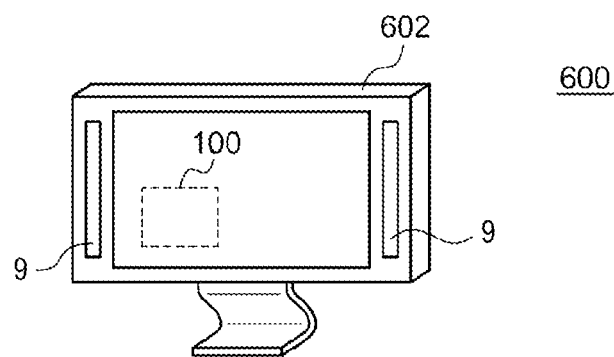
FIGS. 7A to 7C are external views of an electronic device and an audio component apparatus.
Figure 7B:
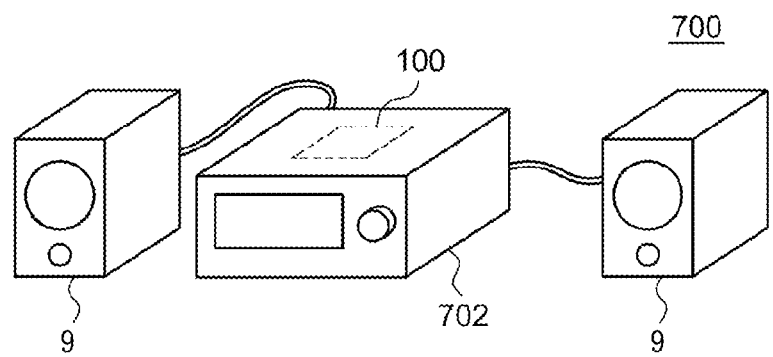
Figure 7C:
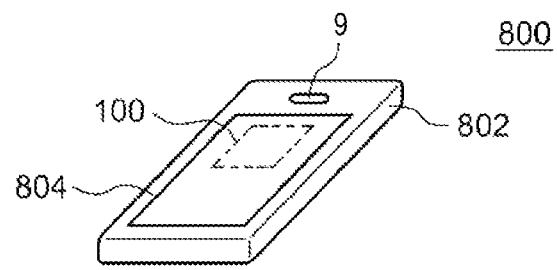

FIGS. 7A to 7C are diagrams showing the appearance of an electronic device or an audio component apparatus including the audio signal processing circuit 100. FIG. 7A shows a display device 600 as an example of the electronic device. The display apparatus 600 includes a housing 602 and speakers 9. The audio signal processing circuit 100 is built in the housing to drive speakers 9.

FIG. 7B shows an audio component 700. The audio component 700 includes a housing 702 and speakers 9. The audio signal processing circuit 100 is built in the housing 702 to drive the speakers 9.

FIG. 7C shows a portable information terminal 800 as an example of the electronic device. The portable information terminal 800 may be a mobile phone, a PHS (Personal Handyphone System), a PDA (Personal Digital Assistant), a tablet PC (Personal Computer), an audio player or the like. The portable information terminal 800 includes a housing 802, a speaker 9, and a display 804. The audio signal processing circuit 100 is built in the housing 802 to drive the speaker 9.

According to the audio signal processing circuit of the present application, the analog amplifier and the digital signal processing unit are integrated on a single semiconductor substrate, thereby suppressing the deterioration of the sound quality.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An audio signal processing circuit for receiving an analog single-ended input audio signal and performing a predetermined signal processing thereon to generate an analog single-ended output audio signal, the audio signal processing circuit comprising:
    a first amplifier configured to perform a non-inverting amplification on the input audio signal to generate a first analog audio signal;
    a second amplifier configured to perform an inverting amplification on the first analog audio signal to generate a second analog audio signal;
    an analog/digital converter having differential input terminals which includes a positive input terminal and a negative input terminal, and configured to receive the first analog audio signal at the positive input terminal and the second analog audio signal at the negative input terminal and convert them into a first digital audio signal;
    a digital signal processing unit configured to perform a predetermined signal processing on the first digital audio signal to output a second digital audio signal;
    a digital/analog converter configured to convert the second digital audio signal into differential third analog audio signals including a positive signal and a negative signal;
    a third amplifier configured to invert the positive signal of the third analog audio signals and add it to the negative signal of the third analog audio signals to generate a single-ended fourth analog audio signal; and a fourth amplifier configured to perform an inverting amplification on the fourth analog audio signal to generate the output audio signal, wherein the audio signal processing circuit is integrated on a single semiconductor substrate.

2. The audio signal processing circuit of claim 1, wherein the first amplifier includes:
a first resistor and a second resistor configured to divide the input audio signal and a predetermined bias voltage; and
a first operational amplifier configured to receive the divided audio signal to output the first analog audio signal.

3. The audio signal processing circuit of claim 1, wherein the second amplifier includes:
a second operational amplifier, a predetermined bias voltage being applied to a non-inverting input terminal of the second operational amplifier;
a third resistor provided between an inverting input terminal of the second operational amplifier and an output terminal of the first amplifier; and
a fourth resistor provided between an output terminal and the inverting input terminal of the second operational amplifier.

4. The audio signal processing circuit of claim 1, wherein the third amplifier includes:
a third operational amplifier;
a fifth resistor provided between a non-inverting input terminal of the third operational amplifier and a negative output terminal of the digital/analog converter;
a sixth resistor provided between a bias line to which a predetermined bias voltage is supplied and the non-inverting input terminal of the third operational amplifier;
a seventh resistor provided between an output terminal and an inverting input terminal of the third operational amplifier; and
an eighth resistor provided between the inverting input terminal of the third operational amplifier and a positive output terminal of the digital/analog converter.

5. The audio signal processing circuit of claim 1, wherein the fourth amplifier includes:
a fourth operational amplifier, a predetermined bias voltage being applied to a non-inverting input terminal of the fourth operational amplifier;
a ninth resistor provided between an inverting input terminal of the fourth operational amplifier and an output terminal of the third amplifier; and
a tenth resistor provided between an output terminal and the inverting input terminal of the fourth operational amplifier.

6. The audio signal processing circuit of claim 1, wherein the fourth amplifier is a variable gain amplifier.

7. The audio signal processing circuit of claim 1, wherein the third amplifier is a part of a filter.

8. A car audio apparatus comprising the audio signal processing circuit of claim 1.

9. An audio component apparatus comprising the audio signal processing apparatus of claim 1.

10. An electronic device comprising the audio signal processing circuit of claim 1.

11. An audio signal processing circuit for receiving an analog single-ended input audio signal and performing a predetermined signal processing thereon to generate an analog single-ended output audio signal, comprising:
a first amplifier configured to perform a non-inverting amplification on the input audio signal to generate a first analog audio signal;
a second amplifier configured to perform an inverting amplification on the first analog audio signal to generate a second analog audio signal;
an analog/digital converter having differential input terminals which includes a positive input terminal and a negative input terminal, and configured to receive the first analog audio signal at the positive input terminal and the second analog audio signal at the negative input terminal and convert them into a first digital audio signal;
a digital signal processing unit configured to perform a predetermined signal processing on the first digital audio signal to output a second digital audio signal;
a digital/analog converter configured to convert the second digital audio signal into differential third analog audio signals including a positive signal and a negative signal;
a third amplifier configured to subtracts the positive signal of the third analog audio signals from the negative signal of the third analog audio signals to generate a single-ended fourth analog audio signal; and
a fourth amplifier configured to perform an inverting amplification on the fourth analog audio signal to generate the output audio signal,
wherein the audio signal processing circuit is integrated on a single semiconductor substrate.

12. An output audio signal generating method for receiving an analog single-ended input audio signal and performing a predetermined signal processing thereon to generate an analog single-ended output audio signal with an integrated circuit integrated on a single semiconductor substrate, the method comprising:
performing a non-inverting amplification on the input audio signal to generate a first analog audio signal;
performing an inverting amplification on the first analog audio signal to generate a second analog audio signal;
inputting the first analog audio signal to a positive input terminal of an analog/digital converter and inputting the second analog audio signal to a negative input terminal of the analog/digital converter and converting them into a first digital audio signal, the analog/digital converter having differential input terminals including the positive input terminal and the negative input terminal;
performing a predetermined signal processing on the first digital audio signal to output a second digital audio signal;
converting the second digital audio signal into differential third analog audio signals including a positive signal and a negative signal;
inverting the positive signal of the third analog audio signals and adding it to the negative signal of the third analog audio signals to generate a single-ended fourth analog audio signal; and
performing an inverting amplification on the fourth analog audio signal to generate the output audio signal.

13. An output audio signal generating method for receiving an analog single-ended input audio signal and performing a predetermined signal processing thereon to generate an analog single-ended output audio signal with an integrated circuit integrated on a single semiconductor substrate, the method comprising:
performing a non-inverting amplification on the input audio signal to generate a first analog audio signal;
performing an inverting amplification on the first analog audio signal to generate a second analog audio signal;
inputting the first analog audio signal to a positive input terminal of an analog/digital converter and inputting the second analog audio signal to a negative input terminal of the analog/digital converter and converting them into a first digital audio signal, the analog/digital converter having differential input terminals including the positive input terminal and the negative input terminal;

performing a predetermined signal processing on the first digital audio signal to output a second digital audio signal;

converting the second digital audio signal into differential third analog audio signal signals including a positive signal and a negative signal;

subtracting the positive signal of the third analog audio signals from the negative signal of the third analog audio signals to generate a single-ended fourth analog audio signal; and performing an inverting amplification on the fourth analog audio signal to generate the output audio signal.

* * * * *